United States Patent [19]
Poole

[11] Patent Number: 5,675,529
[45] Date of Patent: Oct. 7, 1997

[54] FAST ACCESS MEMORY ARRAY

[75] Inventor: David W. Poole, Mountain View, Calif.

[73] Assignee: Sun Microsystems, Inc., Mountain View, Calif.

[21] Appl. No.: 499,259

[22] Filed: Jul. 7, 1995

[51] Int. Cl.$^6$ .................................................. G11C 5/06
[52] U.S. Cl. ...................... 365/63; 365/149; 365/189.09; 365/203
[58] Field of Search .................... 365/63, 189.09, 365/203, 149

[56] References Cited

U.S. PATENT DOCUMENTS

| | | | |
|---|---|---|---|
| 4,807,194 | 2/1989 | Yamada et al. | 365/207 |
| 5,060,230 | 10/1991 | Arimoto et al. | 371/21.1 |
| 5,117,389 | 5/1992 | Yiu | 365/104 |
| 5,353,255 | 10/1994 | Komuro | 365/208 |
| 5,495,440 | 2/1996 | Asakura | 365/149 |

FOREIGN PATENT DOCUMENTS

D258715  8/1987  European Pat. Off. .

OTHER PUBLICATIONS

07/960,616 Oct. 14, 1992 Santoro et al.
"A Self Terminating Low-Voltage Swing CMOS OUtput Driver", by Thomas F. Knight, Jr., IEEE Journal of Solid--State Circuits, vol. 23, No. 2, Apr. 1988, pp. 457–464.
"A 60ns 3.3V 16MB DRAM", by Arimoto et al., ISSCC 89, Feb. 17, 1989, pp. 244–245.
"A IMb CMOS DRAM with a Divided Bitline Matrix Architecture", by Taylor & Johnson, Mostek Corporation, ISSCC 85, Feb. 15, 1985, pp. 242–243.

*Primary Examiner*—Son T. Dinh
*Attorney, Agent, or Firm*—James W. Rose

[57] ABSTRACT

A memory array with improved access time is disclosed. In one embodiment, the memory array includes a plurality of memory cells arranged in rows and columns. Each one of the plurality of columns includes a global bit line, a local bit line with a memory cell coupled thereto, and an MOS switch configured to selectively couple the local bit line and the global bit line in response to a column select signal. In a second embodiment, the memory array includes a plurality of sense amplifiers located at the periphery of the array, and a plurality of columns associated with the plurality of sense amplifiers respectively. Each one of the plurality of columns includes a global bit line, a local bit line with a memory cell coupled thereto; and a switch coupled between the local bit line and the global bit line and configured to selectively move the global bit line in response to the contents of the memory cell during a read operation. In either embodiment, the switch is an MOS transistor having its drain coupled to the global bit line, its gate coupled to the local bit line, and its source coupled to a reference voltage. During operation, a word line coupled to the memory cell is activated at approximately the same time as the column select signal to access the memory cell. The configuration of the MOS transistor switches provides for maximum transconductance in discharging the global bit lines.

56 Claims, 3 Drawing Sheets

FAST ACCESS MEMORY ARRAY

BACKGROUND OF THE INVENTION

1. Field of the Invention

The present invention relates to computer memory, and more particularly, to random access memory arrays.

2. Background

The memory hierarchy in a microprocessor based computer includes, from top-to-bottom, a register file, an "on-chip" cache, sometimes an "off-chip" cache, main memory, and disk storage. The register file and on-chip cache are usually implemented in two separate static random access memory (SRAM) arrays located on the microprocessor chip. The off-chip cache, if used, includes one or more dedicated SRAM chips located in close proximity to the microprocessor. The main memory is implemented in a set of dedicated dynamic random access memory (DRAM) chips also located in close proximity to the microprocessor chip. SRAM is fast and expensive, and is therefore used for the top levels of the memory array. DRAM, which is generally slower but more dense than SRAM, is typically used for main memory.

The traditional design for both SRAM and DRAM includes an array of memory cells arranged in rows and columns. A plurality of word lines are associated with each row in the array. In the case of SRAMs, differential bit lines are associated with each column in the array. With DRAMs, typically a single bit line is associated with each column in the array. In either case, the bit lines run from the top to the bottom of the array. A sense amplifier, located at the periphery of the array, is used to sense the data on the bit lines. One drawback with the traditional array design is the relatively large amount of capacitance present on the bit lines due to: (1) the large number of memory cells coupled to each differential bit line pair; and (2) the relatively long length of the bit lines. As a result, it takes a long period of time for a memory cell being accessed to move its associated differential bit lines (SRAM) or bit line (DRAM) by a sufficient voltage to be sensed by the sense amplifier at the periphery of the array. Memory designers have attempted several approaches to alleviate this problem.

One known technique to improve the access speed of an SRAM is to break up the array into a plurality of banks. Each bank includes its own set of periphery circuitry, including decoders, sense amplifiers and column select circuits. The output of each bank is routed to a multiplexor, which selects the final output. The smaller size of each bank reduces the number of memory cells coupled to each differential bit line pair, which shortens the length of the bit lines, making the access speed in a banked SRAM faster than otherwise possible in a full array SRAM. While the bank approach provides increased access speed, it does have several drawbacks. Breaking the full array into several banks requires global routing, duplicate decoders, multiplexors and sense amplifiers, all of which add to the size, power consumption, and complexity of the memory. Further, the relatively large size and complexity of the sense amplifier circuits used at the periphery of each bank tends to limit the number of banks that can be used in the memory. Consequently, the number of memory cells coupled to each differential bit line pair is still relatively large. The delays caused by the number of memory cells and the capacitance on the bit lines is therefore only partially reduced. In the bank SRAMs known by the Applicant, either one hundred and twenty eight or two hundred and fifty six memory cells are associated with each bit line per bank.

In co-pending, U.S. Application Ser. No. 07/960,616 entitled *Embedded Access Trees for Memory Arrays*, filed Oct. 14, 1992 by Santoro, and commonly assigned to the assignee of the present application, an SRAM divided into subarrays is disclosed. Each subarray includes a group of memory cells coupled to differential local bit lines. A pair of complementary embedded sense amplifiers (ESAs) are coupled between the local differential bit lines and the corresponding global differential bit lines respectively. The first ESA includes a bipolar transistor having its base coupled to a subarray select line and one of the complementary local bit lines, its collector coupled to a power source VDD, and its emitter coupled to one of the complementary global bit lines. The second ESA includes a bipolar transistor having its base coupled to the subarray select line and the second of the complementary local bit lines, its collector coupled to VDD, and its emitter coupled to the second of the complementary global bit lines. Prior to a read operation, the local bit lines are pre-charged in subarray. The subarray select line is then activated, pulling the base of the two bipolar transistors high. A short time later, a local word line in the subarray is activated, turning on the pass transistors of one of the memory cells in the subarray. Depending on the contents of the accessed memory cell, one of the local bit line dissipates through the accessed memory cell, pulling down the base of the respective bipolar transistor. The bipolar transistor consequently turns off, and the corresponding global bit line remains low. The complement local bit line, however remains high, causing the complement bipolar transistor to turn on. The complement global bit line is therefore pulled up. A second sense amplifier, located at the periphery of the array, then senses the data on the global differential bit line pair. The problem with the ESA approach by Santoro is that it requires a bipolar transistor in an MOS memory array. BiCMOS processes, although well known, are difficult and expensive to implement.

In "*A 1 Mb CMOS DRAM with a Divided Bitline Matrix Architecture*", IEEE International Solid State Circuits Conference, 1985, by Ron Taylor and Mark Johnson, a DRAM divided into a number of subarrays is disclosed. Each subarray includes a plurality of memory cells coupled to a local bit line. A switching transistor, having its source and drain coupled between the local and a global bit line, is used to selectively couple the local and global bit lines. During a read operation, the finite charge stored in an access cell is used to move the local bit line and global bit line through the source-drain of the switching transistor. A sense amplifier located at the end of the global bit line then senses the data on the global bit line. The advantage of this technique is that the finite charge in the memory cell has an easier task of moving the local and global bit line because the memory cell is isolated from the other subarrays. As a result, there is less capacitance on the global bit line. The disadvantage of the DRAM taught by Taylor is that the transistor coupled between the local and global bit lines simply acts as a switch. The switch, by itself, does nothing to enhance the access time performance. Rather, the source-drain channel of the switching transistor actually adds to the capacitive load on the local and global bit line combination. Accordingly, the switching transistor arrangement taught by Taylor and Johnson is less than ideal.

In U.S. Pat. No. 5,060,230 entitled "*On Chip Semiconductor Memory Arbitrary Pattern, Parallel Test Apparatus and Method*", issued Oct. 22, 1991 to Arimoto, and in the paper entitled "*A 60 ns 3.3V 16 Mb DRAM*", IEEE International Solid State Circuits Conference, 1989, by Arimoto, a DRAM divided into subarrays is disclosed. Each subarray includes a plurality of memory cells coupled to a local bit line. A sense amplifier and an MOS switch are coupled between each local bit line and a corresponding global bit line. The sense amplifier is activated by a clock signal $\phi S$. The MOS switch is activated by a timing signal (SW). During a read operation, the accessed memory cell moves its local bit line. The sense amplifier associated with the subarray senses and amplifies the signal on the local bit line. The sensed and amplified data signal is then transferred through the MOS switch onto the corresponding global bit line associated with the subarray. A column select circuit is then used to select the column that contains the accessed memory cell.

A number of drawbacks are associated with the array of Arimoto. To achieve high density, the memory cells in the DRAM of Arimoto are very small, which means they are capable of storing a very limited charge. When a memory cell is accessed, the memory cell has a difficult time moving its associated local bit line. Although Arimoto fails to disclose the actual sense amplifiers used, it is believed that a very sensitive sense amplifier is needed between the local and global bit lines. Such sense amplifiers are typically slow, which increases the access time in the array. Another problem with sensitive sense amplifiers is that they usually occupy a relatively large space on the die because they require many transistors to implement. The number of sense amplifiers that can therefore be practically used in the array is limited, resulting in a relatively large number of memory cells in each subarray. The problems of capacitance on the local bit lines is therefore only partially alleviated. Further, the timing of both the sense amplifier clock signal $\phi s$ and the switching signal (SW) need to coincide for correct operation. If the two signals do not coincide, a proper read access operation will not occur. The additional circuitry needed to generate the signal $\phi s$ and the signal (SW) further complicates the design of the memory array.

The Applicant believes that the prior art techniques for reading a memory cell or cells is inadequate for achieving faster access time in an MOS memory array. The traditional design of using bit lines running from the top to the bottom of the array is a "brute force" approach that is not feasible for achieving a faster access time. The use of banks is also inadequate because of the complexities created by the sense amplifiers and other peripheral circuitry needed by each bank. As a result, the degree to which a large array can be segmented into smaller banks is limited. The DRAM subarray techniques taught by Taylor and Arimoto also have their limitations. In Taylor, sensing is performed by a single sense amplifier stage located at the periphery of the memory array. In Arimoto, the sensing is performed by a single stage located between the local and global bit lines in the array. In either case, it is believed that a sensitive, but slow, sense amplifier is needed. The Applicant therefore believes that a new and optimal way to perform read operations in a memory array is needed.

Applicant is also not aware of any prior art memory design wherein the column select function takes place prior to the selection and access of a memory cell or cells. In prior art memory arrays, the column select takes place only after a row of memory cells have been accessed. This arrangement needlessly activates all the memory cells, and the associated sense amplifiers, MOS switches, etc. along the row containing the memory cell to be accessed. This arrangement consumes power, creates spurious noise, and adds to the complexity of the memory array.

SUMMARY OF THE INVENTION

The present invention is related to a memory array with improved access time. In one embodiment, the memory array includes a plurality of memory cells arranged in rows and columns. Each one of the plurality of columns includes a global bit line, a local bit line with a memory cell coupled thereto, and an MOS switch configured to selectively couple the local bit line and the global bit line in response to a column select signal. In a second embodiment, the memory array includes a plurality of sense amplifiers located at the periphery of the array, and a plurality of columns associated with the plurality of sense amplifiers respectively. Each one of the plurality of columns includes a global bit line, a local bit line with a memory cell coupled thereto; and a switch coupled between the local bit line and the global bit line and configured to selectively move the global bit line in response to the contents of the memory cell during a read operation. In either embodiment, the switch is an MOS transistor having its drain coupled to the global bit line, its gate coupled to the local bit line, and its source coupled to a reference voltage. During operation, a word line coupled to the memory cell is activated at approximately the same time as the column select signal to access the memory cell. The configuration of the MOS transistor switches provides for maximum transconductance in discharging the global bit lines.

The simple design of the switches, which occupy a relatively small area on the die, permit the bit line function to be highly segmented into a relatively large number of subarrays. The MOS SRAM of the present invention achieves unprecedented read access times because of the synergistic effect of: (1) the relatively short length of the local bit lines; (2) the ability to rapidly move the GRBLs and the $\overline{GRBL}$s through the high transconductance of the MOS switches; and (3) the use of fast, relatively insensitive sense amplifiers at the periphery of the array. Initial simulations by the Applicant indicate that the read access of the present invention is approximately twenty-five percent (25%) faster than the prior art MOS SRAMs known to the Applicant.

DESCRIPTION OF THE DRAWING

The present invention will be apparent from the following description which.

DESCRIPTION OF THE PREFERRED EMBODIMENT

Figure 1:
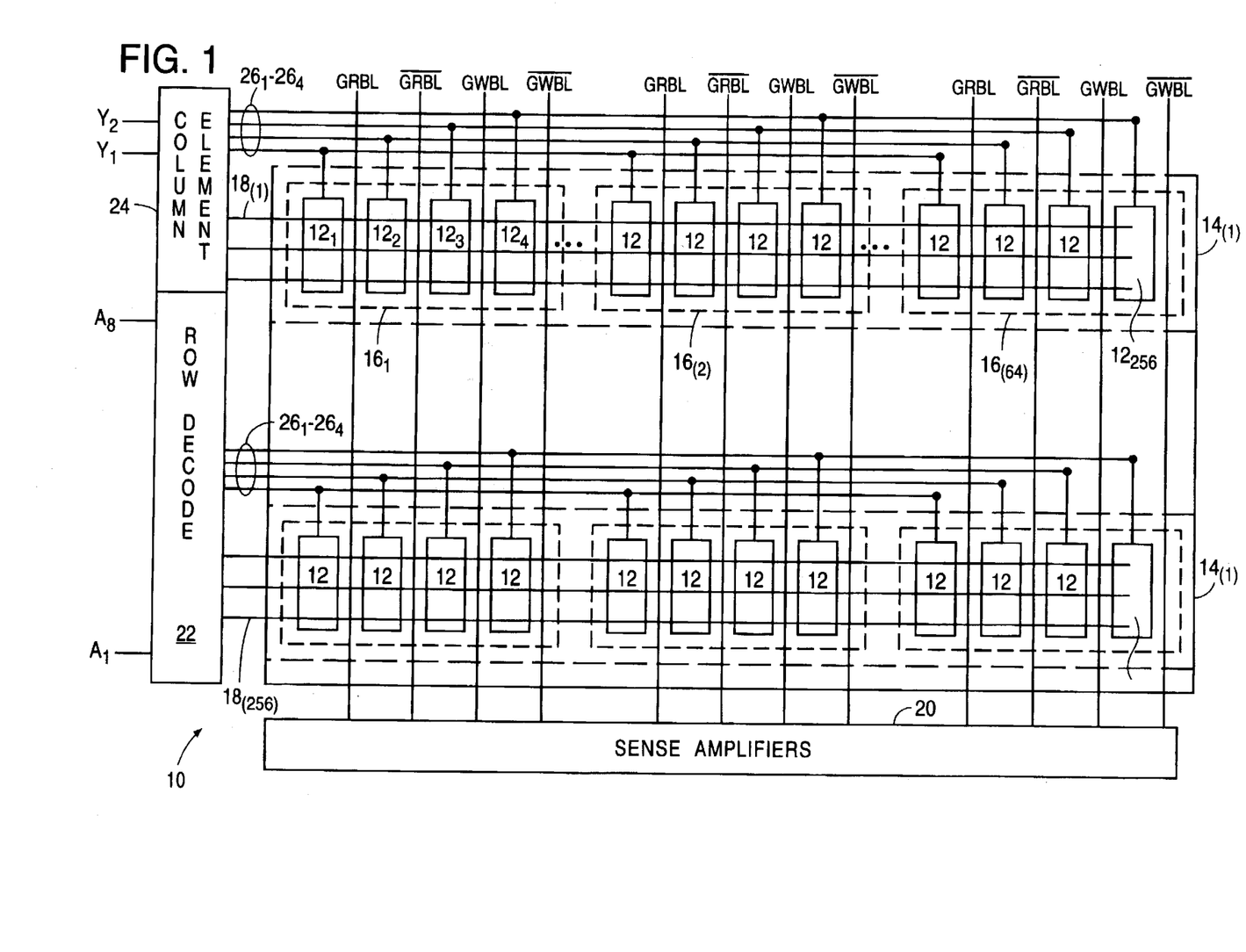
FIG. 1 illustrates a block diagram of the memory array of the present invention.

Referring to FIG. 1, a block diagram of the memory array of the present invention is shown. In one embodiment of the invention, the memory array 10 is a 16K Byte SRAM for use as a first level cache on a semiconductor die containing a microprocessor unit. In the memory array 10, there are two hundred and fifty six rows and two hundred and fifty six columns of memory cells. The memory cells are organized into subarrays 12. Each subarray 12 is a one-by-sixteen array including one memory cell in the horizontal direction and sixteen memory cells in the vertical direction (for the sake of clarity, the memory cells are not shown in the subarrays 12 of FIG. 1). The subarrays 12 are further organized into sixteen banks $14_1$ through $14_{16}$. Each bank $14_1$ through $14_{16}$ includes two hundred and fifty six subarrays 12 (i.e., two hundred and fifty six columns) and sixteen rows of memory cells. With sixteen banks 14 with sixteen rows each, the memory array 10 includes two hundred and fifty six rows.

The two hundred and fifty six rows are activated by two hundred and fifty six word lines $18_1$ through $18_{256}$ respectively. The banks 14 are further divided into sixty four blocks $16_1$ through $16_{64}$. Each block 16 includes four subarrays 12. The blocks $16_1$ through $16_{64}$ of each of the banks $14_1$ through $14_{16}$ are arranged in columns. For each column of blocks $16_1$ through $16_{16}$ in the array 100, a Global Write Bit Line (GWBL), a Global Write Bit Line bar ($\overline{GWBL}$), a Global Read Bit Line (GRBL) and a Global Read Bit Line bar ($\overline{GRBL}$) are provided. The GRBL and $\overline{GRBL}$ and GWBL and $\overline{GWBL}$ associated with each block 16 are multiplexed among the four subarrays 12 of the block 16. The memory array 10 also includes sense amplifiers 20 for sensing the data on one or more of the GRBLs and $\overline{GRBL}$s during a read operation. In one embodiment, the sense amplifier taught by Knight in the article "*A Self-Terminating Low-Voltage Swing CMOS Output Driver*" IEEE Journal of Solid State Circuits, Vol. 23, No.2, April 1988, and incorporated by reference herein, is used for the sense amplifiers 20. The sense amplifiers taught by KNight are high gain, relatively insensitive sense amplifiers, that have the ability to sense data on the GRBLs and $\overline{GRBL}$s much faster than otherwise possible using standard sensitive sense amplifiers believed to be needed by the prior art memory arrays.

The memory array 10 includes a row decode circuit 22. The row decode circuit 25 is coupled to receive eight address bits $A_1$ through $A_8$. In response to a particular combination of address bits $A_1$ through $A_8$ received at the memory array 10, the row decode circuit 22 selects one word line 18 among the two hundred and fifty six word lines $18_1$ through $18_{256}$ in the memory array 10.

The memory array 10 includes a column select circuit 24. Each bank $14_1$ through $14_{16}$ includes four column select lines $26_1$ through $26_4$. The column select circuit 24 is coupled to receive two column select bits $Y_1$ and $Y_2$. In response to the two column select bits $Y_1$ and $Y_2$ one of four column select lines $26_1$ through $26_4$ is activated. For example, if the address bits $A_1$ through $A_8$ select block $14_1$, and if the first column select line $26_1$ is selected, the 1st, 5th, 9th . . . and 253rd subarrays 12 in the bank $14_1$ are activated. If the second column select line $26_2$ is selected, the 2nd, 6th, 10th . . . and 254th subarrays 12 in the bank $14_1$ are activated. If the third column select line $26_3$ is selected the 3rd, 7th, 11th . . . and 255th subarrays 12 in the bank $14_1$ are activated. If the fourth column select line $26_4$ is selected, the 4rd, 8th, 12th . . . and 256th subarrays 12 in the bank $14_1$ are activated. In other words, the column select lines $26_1$ through $26_4$ are responsible for selecting 1st, 2nd, 3rd and 4th subarray in each block $16_1$ through $16_{64}$ in bank $14_1$ respectively. The select lines $26_1$ through $26_4$ for each of the other banks $14_2$ through $14_{16}$ operate in a similar manner. Each row in the array 10 therefore stores four sixty-four bit sliced words.

Figure 2:
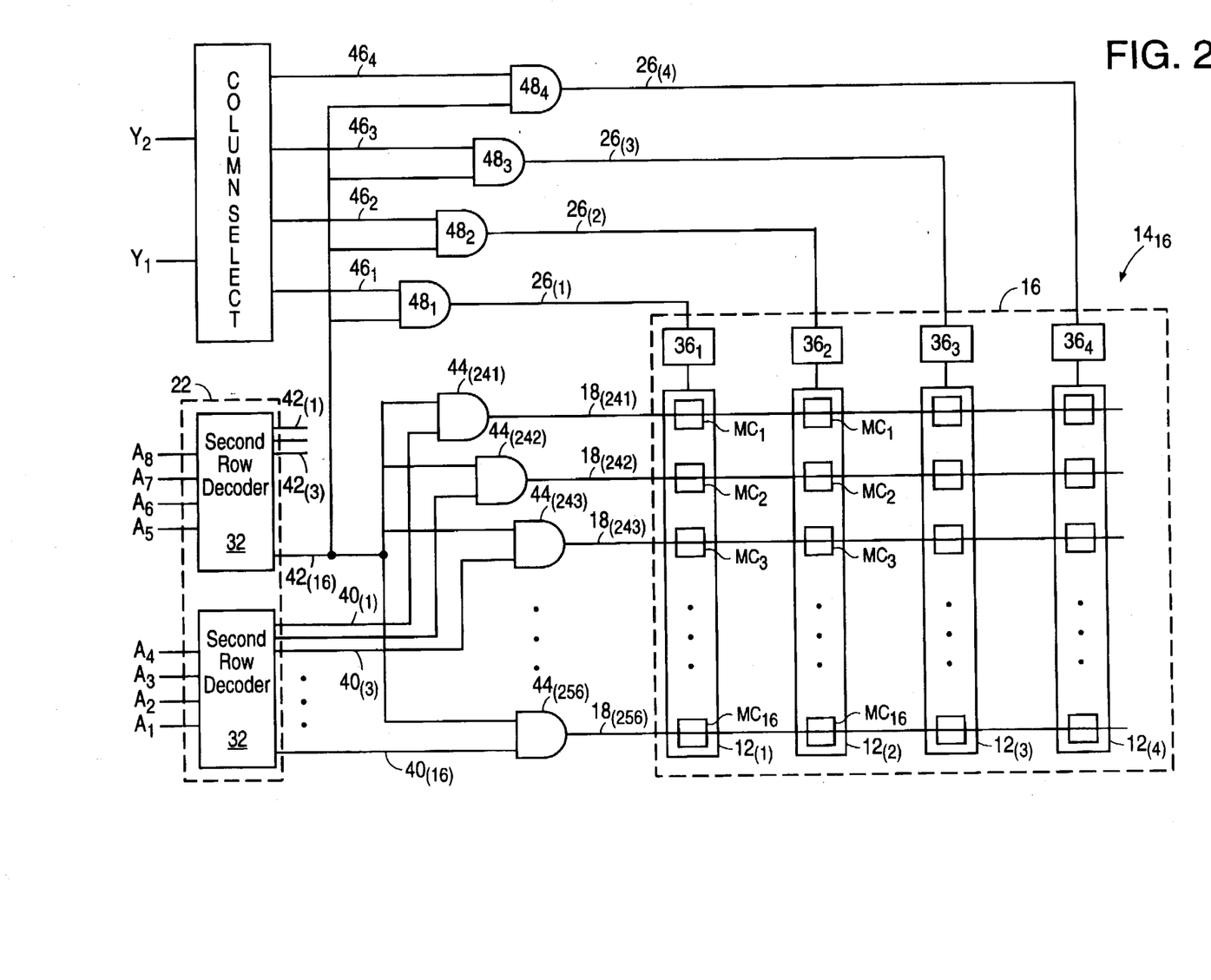
FIG. 2 illustrates the row decode and subarray select circuitry of the present invention.

Referring to FIG. 2, a logic diagram of the row decode circuit 22, the column select circuit 24 and one block 16 in bank $14_{16}$ of the present invention is shown. The row decode circuit 22 includes a first row decoder 30 for decoding the low order bits $A_1$ through $A_4$ of the input address and a second row decoder 32 for decoding the high order bits $A_5$ through $A_8$ of input address. The column select circuit 24 is a decoder for decoding the two column select bits $Y_1$ and $Y_2$. The block 16 includes four subarrays $12_{(1)}$ through $12_{(4)}$. Each subarray includes sixteen memory cells $MC_{(1)}$ through $MC_{(16)}$. Each subarray $12_{(1)}$ through $12_{(4)}$ is activated through global/local bit line switches $36_1$ through $36_4$ respectively. The column select lines $16_1$ through $26_4$ are used to activate the switches $36_1$ through $36_4$ respectively.

The logic used to select a row in the bank $14_{16}$ includes sixteen AND gates $44_{241}$ through $44_{256}$. The output of each AND gate $44_{241}$ through $44_{256}$ is couple to word lines $18_{241}$ through $18_{256}$ respectively. The input of each AND gate $44_{241}$ through $44_{256}$ includes the output $42_{16}$ from the second row decoder 32 and one of the outputs $40_1$ through $40_{16}$ of the first row decoder 30 respectively.

a. Row Select

The second row decoder 32 is a sixteen to one (16:1) multiplexor responsible for selecting one bank 14 among the sixteen banks $14_1$ through $14_{16}$ in the memory array 10. The second row decoder 32 includes sixteen outputs $42_1$ through $42_{16}$. Each one of the sixteen outputs $42_1$ through $42_{16}$ corresponds to one of the sixteen banks $14_1$ through $14_{16}$ of the array 10 respectively. In response to a specific combination of address bits $A_5$ through $A_8$, one and only one of the sixteen outputs $42_1$ through $42_{16}$ transitions high. All the other outputs 42 remain low.

The first decoder 30 is also a sixteen to one (16:1) multiplexor responsible for selecting one word line 18 among the sixteen word lines 18 of the selected bank 14. In response to a specific combination of address bits $A_1$ through $A_4$, one and only one of the outputs $40_{(1)}$ through $40_{(16)}$ is driven high. All the other outputs 40 of the decoder 30 remain low.

To select row $18_{256}$ in bank $14_{16}$ for example, the output $42_{16}$ of the second row decoder 32 must be driven high and the out put $40_{16}$ of the first row decoder 30 must be driven high. Under these conditions, AND gate $44_{256}$ has both its inputs high. As a consequence, the output of $18_{256}$ of AND $44_{256}$ is driven high, thereby selecting row $18_{256}$. The other rows $18_{241}$ through $18_{255}$ are selected in a similar fashion.

Although not illustrated in FIG. 2 for the sake of simplicity, a total of two hundred and fifty six AND gates $44_1$ through $44_{256}$ are used in the memory array 10. The output of each of the AND gates $44_1$ through $44_{256}$ is coupled to the word lines $18_1$ through $18_{256}$ in the memory array 10 respectively. The input to each of the two hundred and fifty six AND gates 44 includes a different combination of the outputs $40_1$ through $40_{16}$ of the first row decoder 30 and the outputs $42_1$ through $42_{16}$ of the second row decoder 32 respectively. As a result, only one word line 18 among the two hundred and fifty six word lines $18_1$ through $18_{256}$ in the memory array 10 is selected in response to a specific combination of address inputs $A_1$ through $A_8$.

Column Select

The column select circuit 24 is a four to one (4:1) multiplexor. In response to a specific combination of column select bits $Y_1$ and $Y_2$, one of the four outputs $46_1$ through $46_4$ of the column select circuit 24 is activated. The four AND gates $48_1$ through $48_4$ are used to logically AND each of the four outputs $46_1$ through $46_4$ with the output $42_{16}$ of the second row decoder 32. The AND gate $48_1$ through $48_4$ having both of its inputs high, drives its corresponding select lines $16_1$ through $26_4$ high (i.e., selected). For example, if the select line $16_1$ is selected, the 1st, 5th, 9th . . . and 253rd subarrays 12 in the bank $14_{16}$ are activated through their respective switches 36. If column select line $26_2$ is selected, the 2nd, 6th, 10th . . . and 254th subarrays 12 in the bank $14_{16}$ are activated through their respective switches 36. If column select line $26_3$ is selected, the 3rd, 7th, 11th . . . and 255th subarrays 12 in the bank $14_{16}$ are activated through their respective switches 36. Finally, if column select line $26_4$ is selected, the 4th, 8th, 12th . . . and 256th subarrays 12 in the bank $14_{16}$ are activated through their respective switches 36.

Again, for the sake of simplicity, only four AND gates 48 are shown in FIG. 2. The memory 10 actually includes a total of sixty four AND gates 48. Four AND gates 48 are provided for each bank $14_1$ through $14_{16}$. For each bank $14_1$ through $14_{16}$, the four AND gates 48 receive one of the four outputs $46_1$ through $46_4$ and one of the outputs $42_1$ through $42_{16}$ from the second row decoder 32 respectively. The sixty four AND gates 48 are used to select one of the column select line $28_1$ through $28_4$ for each of the sixteen banks $14_1$ through $14_{16}$ in the array 10.

Figure 3:
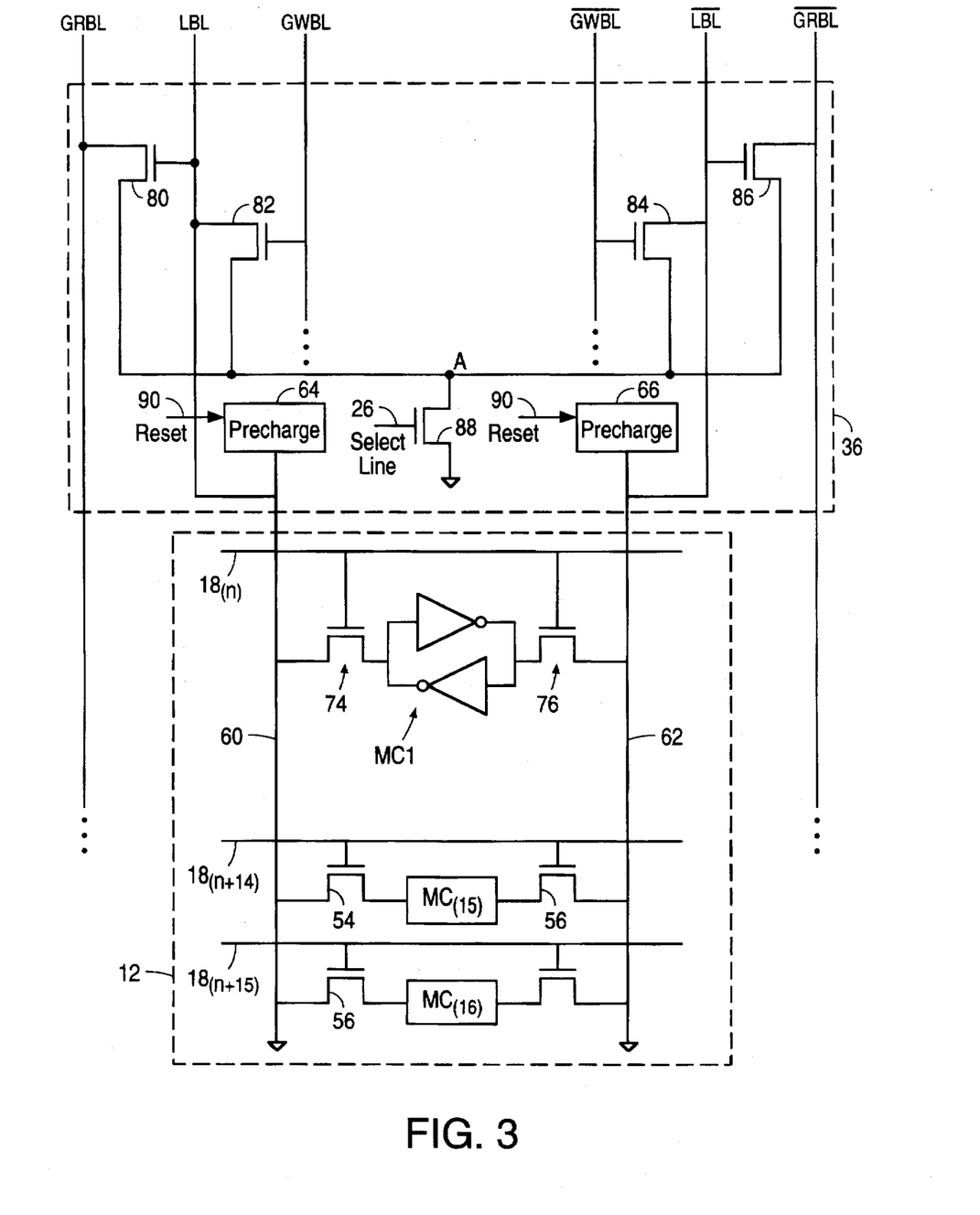
FIG. 3 illustrates a circuit diagram of an SRAM subarray of the present invention.

Referring to FIG. 3, a circuit diagram of a subarray 12 and a switch 36 are shown. The subarray 12 includes sixteen memory cells $MC_1$ through $MC_{16}$, differential local bit lines LBL 60 and $\overline{LBL}$ 62, precharge circuits 64 and 66. Memory cell $MC_1$ includes a pair of cross coupled inverters 70 and 72 and two pass transistors 74 and 76. Precharge circuits 64 and 66 are used to precharge the LBL 60 and $\overline{LBL}$ 62 respectively. The gate of pass transistor 74 is coupled to a word line $18_n$, the source is coupled to the output of inverter 72 and the input of inverter 70, and the drain is coupled to LBL 60. The gate of pass transistor 76 is coupled to the same word line $18_n$, the source is coupled to the output of inverter 70 and the input of inverter 72, and the drain is coupled to the $\overline{LBL}$ 62. Although not described in detail or illustrated, the other memory cells $MC_{(n+1)}$ through $MC_{(n+15)}$ are similar, except their pass transistors are each coupled to a different word line $18_n$ through $18_{n+15}$ respectively. Further, and equalization transistor (not shown) may be placed between the LBL 60 and $\overline{LBL}$ 62 to equalize the differential local bit lines during precharge.

The switch 36 includes N-channel MOS transistors 80, 82, 84, 86 and 88. Transistor 80 has its gate coupled to the LBL 60 of the subarray 12, its drain coupled to the GRBL, and its source coupled to node A. Transistor 82 has its gate coupled to the GWBL, its drain coupled to the LBL 60 of the subarray 12, and its source coupled to node A. Transistor 84 has its gate coupled to $\overline{GWBL}$, its drain coupled to the $\overline{LBL}$ 62 of the subarray 12, and its source coupled to node A. Transistor 86 has its gate coupled to the $\overline{LBL}$ 62 of the subarray 12, its drain coupled to $\overline{GRBL}$, and its source coupled to node A. Transistor 88 has its gate coupled to receive the column select signal 26 responsible for selecting the column containing the subarray 12, its drain coupled to node A, and its source coupled to ground. The relative sizes of the transistors 74–88 are provided below in Table I.

TABLE I

| Transistors(S) | Size |
|---|---|
| 74,76 | X |
| 80,86 | 8X |
| 82,84 | 2X |
| 88 | 10X |

The subarray 12 has three modes of operation, including read, write, and reset, which occurs after either a read or a write operation. Each of these modes are described below.

a. Read Operation

Consider a situation where a logical one is stored in memory cell $MC_1$. When storing a logical one, the output of inverter 70 is high, and the output of inverter 72 is low. In preparation for the read operation, the GRBL and the $\overline{GRBL}$ are precharged. The LBL 60 and $\overline{LBL}$ 62 are also precharged by precharge circuits 64 and 66 respectively. To read the memory cell $MC_1$, the column select line 26 coupled to the gate of transistor 88 and the word line 18 coupled to the pass transistors of 74 and 76 of the memory cell $MC_1$ are both driven high at substantially the same time. As a result, two events occur simultaneously. In the switch 36, the transistor 88 turns on in response to the column select line 26, pulling node A down toward ground. In the subarray 12, the pass transistors 74 and 76 both turn on. Since the output of inverter 70 is high, the precharged $\overline{LBL}$ 62 does not discharge through pass transistor 76 and inverter 72. Consequently, transistor 86 turns on in the switch 36, and the $\overline{GRBL}$ is discharged toward ground at node A. On the complement side of the subarray 12, the precharged LBL 60 is discharged to ground through pass transistor 74 and the inverter 70. As a result, transistor 80 in the switch 36 does not turn on, and the GRBL remains high. With the GRBL high and the $\overline{GRBL}$ low, the sense amplifier 20 determines that a logical one is stored in the memory cell $MC_{(1)}$. If the memory cell $MC_{(1)}$ stores a logical zero, the subarray 12 and the switch 36 operate in the complement of that described above.

It is useful to analyze the read operation described above. The read operation can be broken down into three stages. The Applicant believes that with the present invention, the three stages have been optimized to achieve a read access speed never before possible in MOS SRAM memory arrays. A description of each stage is provided below.

Stage 1: In the first stage, one of the local differential bit lines in the subarray 12 is moved when the memory cell $MC_1$ is accessed. Since the number of memory cells MC associated with the subarray 12 is relatively small (i.e., sixteen memory cells), the capacitance on the local bit lines is relatively small. The local bit lines LBL 60 and $\overline{LBL}$ 62 are therefore capable of moving faster compared to prior art MOS memory arrays.

Stage 2: In stage two, the switches 36 are used to rapidly move the global bit line GRBL and $\overline{GRBL}$ faster than otherwise possible using a simple MOS switch having its source and drain coupled between the local and global bit lines, as taught by Taylor in the prior art. It is useful to mention that the transistor 80 in the switch 36 is configured to discharge the global read bit line GRBL very quickly. The drain of transistor 80 is precharged to VDD when the GRBL is precharged prior to a read operation. The source of transistor 80 is coupled to node A which is at ground (VSS) when the subarray is about to be read. Therefore, the maximum possible voltage (Vds) is applied across the source and drain of the transistor 80 during a read operation, resulting in the maximum possible transconductance of the device. In addition, the relatively large size of transistor 80 provides the device with superior discharge characteristics. The GRBL can therefore be discharged significantly faster than simply dissipating the global and local bit lies through the memory cell $MC_1$. Transistor 86 operates, in a similar manner on the complementary side of the subarray 12.

Stage 3: In stage 3, the relatively insensitive, but fast sensing sense amplifier as taught by Knight is used for the sense amplifiers 20 at the periphery of the memory array 10. It is possible to use a relatively insensitive sense amplifier in the present invention because the global bit lines GRBL and $\overline{GRBL}$ are move much faster than the bit lines in prior art memory arrays, such as that believed to be used by Arimoto and Taylor for example.

The simple design of the switches 36, which occupies a relatively small area on the die, permits the bit line function to be highly segmented into a relatively large number of subarrays. The Applicant believes that the MOS SRAM of the present invention achieves unprecedented read access times because of the synergistic effect of: (1) the relatively short local bit lines; (2) the ability to rapidly move the GRBLs and the $\overline{\text{GRBL}}$s through the high transconductance MOS switches; and (3) the use of fast, relatively insensitive, sense amplifiers at the periphery of the array. Initial simulations by the Applicant indicate that the overall read access time of the memory array of the present invention is approximately twenty-five percent (25%) faster than the prior art MOS SRAMs known to the Applicant.

b. Write Operation

During a write operation, the data placed on the GWBL and $\overline{\text{GWBL}}$ is stored in a selected one of the memory cells $MC_1$ through $MC_{16}$ of the subarray 12. Consider an exampled when a logic zero is to be stored in the memory cell MC(1). Under this circumstance, the GWBL is pulled low and $\overline{\text{GWBL}}$ is charged high. The LBL 60 and the $\overline{\text{LBL}}$ 62 are also both precharged high prior to the write operation. To initiate the write operation, the column select line 26 is driven high, turning on transistor 88 and pulling node A down toward ground. The word line $18_n$ is also driven high approximately the same time, turning on the pass transistors 74 and 76 of the memory cell $MC_1$. Transistor 84 in the switch 36 rams on because $\overline{\text{GWBL}}$ coupled to its gate is high, causing the $\overline{\text{LBL}}$ to discharge through transistor 84 at node A to ground. A low input is therefore provided at the input of inverter 72, causing a high output to be generated at the output of the inverter 72. On the complement side of the circuit, transistor 82 of the switch 36 remains off because the GWBL is low. As a result, the LBL 60 does not discharge and remains high, and provides a logical high input to inverter 70, which in turn generates a logical low at the output of inverter 70. The inverters 70 and 72 regeneratively drive one another thereby preserving the integrity of the data in the $MC_1$ without the need to perform a refresh.

Reset Operation

After a read or a write operation, the LBL 60 and $\overline{\text{LBL}}$ 62 have to be precharge again in preparation for the next access operation. The LBL 60 and $\overline{\text{LBL}}$ 62 are precharged by the precharge circuits 64 and 66 respectively in response to a reset signal 90. The reset signal is a delayed version of the column select line 26. The delay is sufficiently long so that the precharging of the LBL 60 and $\overline{\text{LBL}}$ 62 occurs after an access, but not long enough so that the precharging interferes with a subsequent access. In one embodiment, the reset signal is generated by several delay logic gates that receives the column select line 26 and generates the reset signal in a predetermined time thereafter.

The present invention was described with respect to a specific cache SRAM array. The present invention can be used for any type of SRAM application, such as for a register file on a microprocessor chip, a dedicated SRAM chip, etc. Further, although the present invention was described with respect to an SRAM memory, the principles and teachings of the present invention could also be used in any type of memory array, including DRAMs, EPROMS, EEPROMS, and ROM. It is intended that the specification be exemplary, and that the true scope of the invention be determined by the following claims.

What is claimed is:

1. A memory array including a plurality of memory cells arranged in rows and columns, comprising:
   a plurality of columns, each one of the plurality of columns including:
   a global bit line;
   a local bit line with a memory cell coupled thereto; and
   an MOS switch having its drain coupled to the global bit line, its gate coupled to the local bit line, and its source coupled to a reference voltage and configured to selectively couple the local bit line and the global bit line in response to a column select signal.

2. The memory array of claim 1, wherein the reference voltage is a variable reference voltage, the variable reference voltage varying between a first voltage level which activates the MOS switch when the memory cell is being read, and a second voltage level which deactivates the MOS switch when the memory cell is not being read.

3. The memory array of claim 1, further comprising an activation switch which is activated by the column select signal, the activation switch is further configured to transition the variable reference voltage between the first voltage level and the second voltage level in response to the column select signal.

4. The memory array of claim 3, wherein the activation switch is a transistor having its control electrode coupled to receive the column select signal, its source coupled to ground, and its drain coupled to a precharge voltage.

5. The memory array of claim 1, further comprising a second MOS switch configured to selectively couple a global write bit line and the local bit line when the memory cell is to be written.

6. The memory array of claim 5, wherein the second MOS switch includes a transistor having its gate coupled to the global write bit line, its drain coupled to the local bit line, and its source coupled to a reference voltage.

7. The memory array of claim 6, wherein the reference voltage is a variable reference voltage, the variable reference voltage varying between a first voltage level which activates the second MOS switch during a write operation of the memory cell, and a second voltage level which deactivates the second MOS switch when the memory cell is not being written.

8. The memory array of claim 1, wherein the local bit line further includes a plurality of the memory cells, the plurality of memory cells coupled to the local bit line forming a subarray.

9. The memory array of claim 8, further comprising a plurality of the subarrays arranged into banks.

10. The memory array of claim 9, wherein the banks are further divided into a plurality of blocks.

11. The memory array of claim 10, wherein the column select signal is responsible for activating one column in each of the plurality of blocks in a selected one of the banks.

12. The memory array of claim 1, wherein the memory cell is a dynamic random access memory.

13. The memory array of claim 1, wherein the memory cell is a static random access memory.

14. The memory array of claim 1, wherein each of the plurality of columns further comprises:
   a differential global bit line;
   a differential local bit line with the memory cell coupled thereto; and
   a differential MOS switch configured to selectively couple the differential local bit line and the differential global bit line in response to the column select signal.

15. A memory array including a plurality of memory cells arranged in rows and columns, comprising:
   a plurality of sense amplifiers located at the periphery of the subarray;
   a plurality of columns associated with the plurality of sense amplifiers respectively, each one of the plurality of columns including:
   a global bit line;
   a local bit line with a memory cell coupled thereto; and a switch coupled between the local bit line and the global bit line and configured to selectively move the global bit line in response to the contents of the memory cell during a read operation, wherein the switch is an MOS transistor having its drain coupled to the global bit line, its gate coupled to the local bit line, and its source coupled to a reference voltage.

16. A method of providing a memory array including a plurality of memory cells arranged in rows and columns, the method comprising:

providing a plurality of columns, each one of the plurality of columns including:
providing a global bit line;
providing a local bit line with a memory cell coupled thereto; and
providing an MOS switch having its drain coupled to the global bit line, its gate coupled to the local bit line, and its source coupled to a reference voltage and configured to selectively couple the local bit line and the global bit line in response to a column select signal.

17. The method of claim 16, further comprising the step of providing a column select circuit coupled to receive a column decode signal from a column decoder and configured to generate the column select signal in response thereto.

18. The method of claim 17, further comprising the step of providing a word line coupled to the memory cell, wherein the word line and the column select line are both activated at approximately the same time when the memory cell is to be accessed.

19. A method of providing a memory array including a plurality of memory cells arranged in rows and columns, comprising the steps of:

providing a plurality of sense amplifiers located at the periphery of the subarray;
providing a plurality of columns associated with the plurality of sense amplifiers respectively, each one of the plurality of columns including:
providing a global bit line;
providing a local bit line with a memory cell coupled thereto; and
providing a switch coupled between the local bit line and the global bit line and configured to selectively move the global bit line in response to the contents of the memory cell during a read operation, wherein the provided switch is an MOS transistor having its drain coupled to the global bit line, its gate coupled to the local bit line, and its source coupled to a reference voltage.

20. A method of operating a memory array having a plurality of columns, each one of the plurality of columns including a global bit line, a local bit line with a memory cell coupled thereto and a switch configured to selectively couple the local bit line and the global bit line in response to a column select signal, the method comprising the steps of:

generating a column select signal in response to an output signal from a column decoder;
activating a word line associated with the memory cell to substantially coincide with the step of generating the column select signal;
selectively coupling the local bit line and the global bit line in response to a column select signal; and
accessing the memory cell.

21. The memory array of claim 15, further comprising a column select circuit coupled to receive a column decode signal from a column decoder and further configured to generate the column select signal in response thereto.

22. The memory array of claim 21, further comprising a word line coupled to the memory cell, wherein the word line and the column select line are both activated at approximately the same time when the memory cell is to be accessed.

23. The memory array of claim 15, wherein the reference voltage is a variable reference voltage, the variable reference voltage varying between a first voltage level which activates the MOS switch when the memory cell is being read, and a second voltage level which deactivates the MOS switch when the memory cell is not being read.

24. The memory array of claim 15, further comprising an activation switch which is activated by the column select signal, the activation switch is further configured to transition the variable reference voltage between the first voltage level and the second voltage level in response to the column select signal.

25. The memory array of claim 24, wherein the activation switch is a transistor having it control electrode coupled to receive the column select signal, its source coupled to ground, and it drain coupled to a precharge voltage.

26. The memory array of claim 15, further comprising a second MOS switch configured to selectively couple a global write bit line and the local bit line when the memory cell is to be written.

27. The memory array of claim 26, wherein the second MOS switch includes a transistor having its gate coupled to the global write bit line, its drain coupled to the local bit line, and its source coupled to a reference voltage.

28. The memory array of claim 27, wherein the reference voltage is a variable reference voltage, the variable reference voltage varying between a first voltage level which activates the MOS switch when the memory cell is being written, and a second voltage level which deactivates the MOS switch when the memory cell is not being written.

29. The memory array of claim 15, wherein the local bit line further includes a plurality of the memory cells, the plurality of memory cells coupled to the local bit line forming a subarray.

30. The memory array of claim 15, further comprising a plurality of the subarrays arranged into banks.

31. The memory array of claim 30, wherein the banks are further divided into a plurality of blocks.

32. The memory array of claim 31, wherein the column select signal is responsible for activating one column in each of the plurality of blocks in a selected one of the banks.

33. The memory array of claim 15, wherein the memory cell is a dynamic random access memory.

34. The memory array of claim 15, wherein the memory cell is a static random access memory.

35. The memory array of claim 15, wherein each of the plurality of columns further comprises:
a differential global bit line;
a differential local bit line with the memory cell coupled thereto; and
a differential MOS switch configured to selectively couple the differential local bit line and the differential global bit line in response to the column select signal.

36. The memory array of claim 15 coupled to a communication mechanism which facilitates communication with a microprocessor.

37. The memory array of claim 36 wherein the microprocessor is responsive to an instruction received over the communication mechanism from at least one data input device and provides information over the communication mechanism to at least one data output device.

38. The method of claim 19, further comprising providing a column select circuit coupled to receive a column decode signal from a column decoder and further configured to generate the column select signal in response thereto.

39. The method of claim 38, further comprising providing a word line coupled to the memory cell, wherein the word line and the column select line are both activated at approximately the same time when the memory cell is to be accessed.

40. The method of claim 19, wherein the reference voltage is a variable reference voltage, the variable reference voltage varying between a first voltage level which activates the MOS switch when the memory cell is being read, and a second voltage level which deactivates the MOS switch when the memory cell is not being read.

41. The method of claim 19, further comprising providing an activation switch which is activated by the column select signal, the activation switch is further configured to transition the variable reference voltage between the first voltage level and the second voltage level in response to the column select signal.

42. The method of claim 41, wherein the activation switch is a transistor having its control electrode coupled to receive the column select signal, its source coupled to ground, and its drain coupled to a precharge voltage.

43. The method of claim 19, further comprising providing a second MOS switch configured to selectively couple a global write bit line and the local bit line when the memory cell is to be written.

44. The method of claim 43, wherein the second MOS switch includes a transistor having its gate coupled to the global write bit line, its drain coupled to the local bit line, and its source coupled to a reference voltage.

45. The method of claim 44, wherein the reference voltage is a variable reference voltage, the variable reference voltage varying between a first voltage level which activates the MOS switch when the memory cell is being written, and a second voltage level which deactivates the MOS switch when the memory cell is not being written.

46. The method of claim 19, wherein the local bit line further includes a plurality of the memory cells, the plurality of memory cells coupled to the local bit line forming a subarray.

47. The method of claim 46 further comprising providing a plurality of the subarrays arranged into banks.

48. The method of claim 47, wherein the banks are further divided into a plurality of blocks.

49. The method of claim 48, wherein the column select signal is responsible for activating one column in each of the plurality of blocks in a selected one of the banks.

50. The method of claim 19, wherein the memory cell is a dynamic random access memory.

51. The method of claim 19, wherein the memory cell is a static random access memory.

52. The method of claim 19, wherein each of the plurality of columns further comprises:

providing a differential global bit line;

providing a differential local bit line with the memory cell coupled thereto; and providing a differential MOS switch configured to selectively couple the differential local bit line and the differential global bit line in response to the column select signal.

53. The memory array of claim 1, further comprising a column select circuit coupled to receive a column decode signal from a column decoder and further configured to generate the column select signal in response thereto.

54. The memory array of claim 53, further comprising a word line coupled to the memory cell, wherein the word line and the column select line are both activated at approximately the same time when the memory cell is to be accessed.

55. The memory array of claim 19 coupled to a communication mechanism which facilitates communication with a microprocessor.

56. The memory array of claim 45 wherein the microprocessor is responsive to an instruction received over the communication mechanism from at least one data input device and provides information over the communication mechanism to it least one data output device.

* * * * *